United States Patent
Rahimo et al.

(10) Patent No.: US 7,446,376 B2
(45) Date of Patent: Nov. 4, 2008

(54) IGBT CATHODE DESIGN WITH IMPROVED SAFE OPERATING AREA CAPABILITY

(75) Inventors: Munaf Rahimo, Uezwil (CH); Stefan Linder, Zofingen (CH)

(73) Assignee: ABB Technology AG, Zurich (CH)

( * ) Notice: Subject to any disclaimer, the term of this patent is extended or adjusted under 35 U.S.C. 154(b) by 21 days.

(21) Appl. No.: 10/579,837

(22) PCT Filed: Nov. 16, 2004

(86) PCT No.: PCT/CH2004/000691

§ 371 (c)(1),
(2), (4) Date: May 17, 2006

(87) PCT Pub. No.: WO2005/048351

PCT Pub. Date: May 26, 2005

(65) Prior Publication Data

US 2007/0158686 A1    Jul. 12, 2007

(30) Foreign Application Priority Data

Nov. 17, 2003    (EP)    ................... 03405816

(51) Int. Cl.
  *H01L 29/66* (2006.01)

(52) U.S. Cl. .................. 257/341; 257/565; 257/592

(58) Field of Classification Search ......... 257/578–593, 257/E29.027, E29.066, E29.197, E21.382; 438/133
See application file for complete search history.

(56) References Cited

U.S. PATENT DOCUMENTS

| 4,443,931 | A | * | 4/1984 | Baliga et al. ................ 438/138 |
| 4,896,196 | A | | 1/1990 | Blanchard et al. |
| 5,451,531 | A | | 9/1995 | Yamaguchi et al. |
| 5,703,383 | A | * | 12/1997 | Nakayama .................. 257/139 |
| 6,025,622 | A | | 2/2000 | Nakagawa et al. |
| 2004/0099905 | A1 | * | 5/2004 | Baliga ........................ 257/328 |

FOREIGN PATENT DOCUMENTS

| EP | 0 633 611 A1 | | 1/1995 |
| EP | 1 058 316 A1 | | 12/2000 |
| EP | 1 227 522 A2 | | 7/2002 |
| IT | 1058316 A1 | * | 12/2000 |
| JP | 1227522 A2 | * | 7/2002 |

* cited by examiner

Primary Examiner—Zandra Smith
Assistant Examiner—Paul E Patton
(74) Attorney, Agent, or Firm—Buchanan Ingersoll & Rooney PC

(57) ABSTRACT

In an insulated gate bipolar transistor, an improved safe operating area capability is achieved according to the invention by a two-fold base region comprising a first base region (81), which is disposed in the channel region (7) so that it encompasses the one or more source regions (6), but does not adjoin the second main surface underneath the gate oxide layer (41), and a second base region (82) is disposed in the semiconductor substrate (2) underneath the base contact area (821) so that it partially overlaps with the channel region (7) and with the first base region (81).

5 Claims, 4 Drawing Sheets

IGBT CATHODE DESIGN WITH IMPROVED SAFE OPERATING AREA CAPABILITY

TECHNICAL FIELD

The invention relates to the field of semiconductor devices. It relates in particular to an insulated gate bipolar transistor as described in the preamble of claim 1.

PRIOR ART

To achieve improved safe operating area (SOA) capability in insulated gate bipolar transistors (IGBTs), a deep, highly doped $p^+$ base region is often introduced for an increased latch-up current during device turn-off. "Deep" in this context refers to the fact that a first depth of the highly doped $p^+$ base region is bigger than a second depth of a channel region of the IGBT. The deep $p^+$ base region performs the following main tasks during a turn-off of the IGBT:

Firstly, it efficiently collects holes during the turn-off. As a consequence, the number of holes that enter a drift region of the IGBT via a channel of the IGBT is minimized. Early parasitic thyristor latch-up is thus prevented.

Secondly, by extending the p+ base region laterally, it protects n+ source regions of the IGBT by minimising a resistance under those regions and by reducing an injection of electrons from the n+ sources. This will also reduce any parasitic thyristor latch-up effects.

To add the deep $p^+$-well, an additional process mask is used. Accurate alignment of the deep p+ well relative to the n+ source regions and thus of the additional process mask is crucial for achieving the aspects described above.

To overcome this problem, shallow $p^+$-regions have been introduced. While those can be diffused through the same mask as the $n^+$ source regions, thus eliminating alignment problems, SOA capability of the resulting IGBTs is reduced at high voltages.

In U.S. Pat. No. 5,023,191 a method for manufacturing an IGBT structure with two partially overlapping $p^+$ base regions, both of which are to extend underneath the $n^+$ source regions, i.e. to be brought close to a channel side edge of said $n^+$ source regions.

DESCRIPTION OF THE INVENTION

It is an object of the invention to provide an insulated gate semiconductor device of the type mentioned initially that overcomes the deficiencies mentioned above.

This object is achieved by an insulated gate semiconductor device according to claim 1.

In an insulated gate semiconductor device according to the invention, a first base region of first conductivity type is disposed in a channel region of first conductivity type formed in a semiconductor substrate, so that said first base region encompasses the IGBT source regions, but does not adjoin a top surface underneath the gate insulation film. In addition, a second base region of first conductivity type is disposed in the semiconductor substrate underneath a base contact area, said base contact area being delimited by one or more source regions, so that the second base region partially overlaps the channel region and the first base region.

By laterally confining the second base region to a region underneath the base contact area, the location of the highest electric field during turn-off is shifted away from a periphery is of the channel region to a region under the base contact area. A fraction of avalanche generated holes that enter the cell via the channel is therefore decreased, and early latch-up is thus prevented.

Further advantageous realizations can be found in the dependent claims.

BRIEF EXPLANATION OF THE FIGURES

The invention will be explained in more detail in the following text with reference to exemplary realizations and in conjunction with the figures, in which.

The reference signs used in the figures are explained in the list of reference signs. In principle, identical reference symbols are used to denote identical parts.

Approaches to Realization of the Invention

Figure 1:
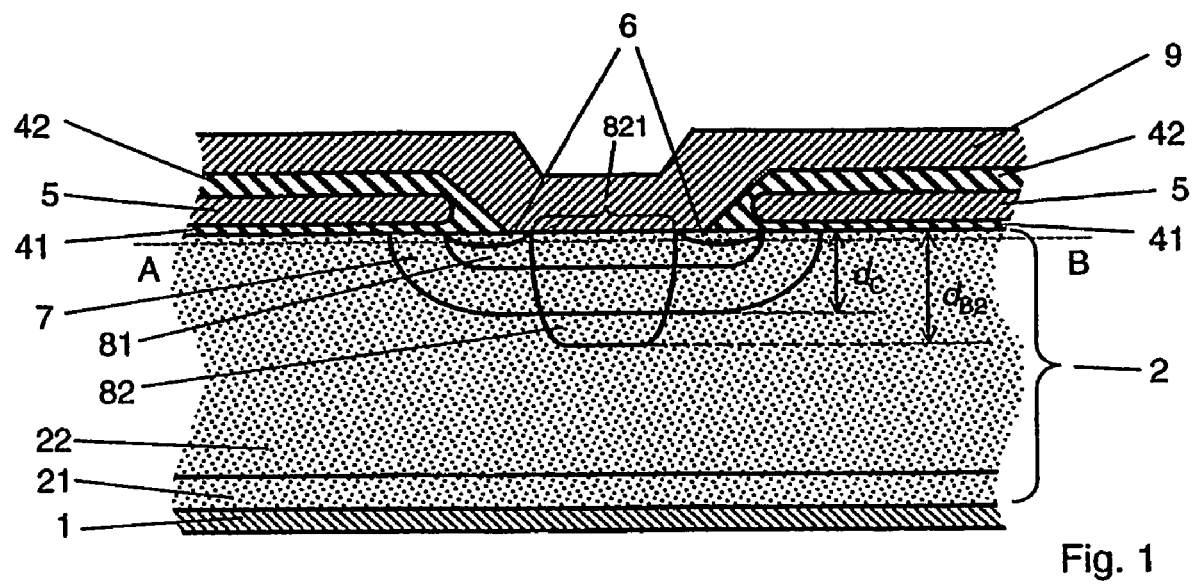
FIG. 1 shows a cross section of an IGBT according to the invention.

FIG. 1 shows a cross section of an IGBT according to the invention. A bottom metallization layer 1 is disposed on a bottom surface of a silicon semiconductor substrate 2. A p doped emitter layer 21 is disposed in the semiconductor substrate 2 and adjoins the bottom surface. Adjoining the emitter layer 21 is an n doped drift region 22. A gate oxide film 41 with a contact opening is disposed on the top surface of the semiconductor substrate 2. A polysilicon gate electrode S is formed on top of the gate oxide film 41 and covered by a silicon oxide insulation layer 42. A p doped channel region 7 is disposed in the drift region 22 and adjoins the top surface underneath the contact opening and underneath part of the gate oxide film 41. Disposed in the channel region 7 are one or more n+ doped source regions 6 which delimit a base contact area 821. A top metallization layer 9 covers the oxide insulation layer 42 and the contact opening. In an on-state of the IGBT, an electrically conducting channel is formed underneath the gate oxide film 41 between the one or more source regions 6 and the drift region 22.

A first $p^+$ doped base region 81 is disposed in the channel region 7 so that it encloses the one or more source regions 6, but does not adjoin the top surface underneath the gate oxide film 41. In other words, the one or more source regions 6, the first base region 81 and the channel region 7 form at least one common boundary line on the top surface of the semiconductor substrate 2.

A second $p^+$ doped base region 82 is disposed in the semiconductor substrate underneath the base contact region. This second base region 82 is narrower and deeper than the first base region 81, so that the first and the second base regions partially overlap one another.

Laterally confining the second base region 82 to a region underneath the base contact area 821 ensures that an avalanche point, i.e. a location of the highest electric field during turn-off, on a first p-n-junction between the channel region 7 and the drift region 22 is more concentrated away from a periphery of channel region 7, resulting in most of the avalanche generated holes not entering the cell via the channel, which would cause early latch-up. As shown in FIG. 1 base region 82 laterally does not extend or overlaps the two source regions 6

In a preferred embodiment of the invention, a depth $d_{B2}$ of the second base region 82 exceeds a depth $d_c$ of the channel region 7 by at least a factor of 1.5, i.e. $d_{B2} > 1.5 \, d_c$. As a consequence, a radius of curvature $r_{B2}$ of a second p-n-junction between the second base region 82 and the drift region 22 is smaller than a radius of curvature $r_c$ of the first p-n-junction between the channel region 7 and the drift region 22. As a consequence, the avalanche point is shifted even further away from the periphery of channel region 7.

In another preferred embodiment of the IGBT according to the invention, a doping concentration $p_{B1}$ of the first base region 81 and a doping concentration $p_{B2}$ of the second base region 82 are at least 5 times higher than a doping concentration $p_c$ of the channel region 7, i.e. $p_{B1} > 5.0 \, p_c$, $p_{B2} > 5.0 \, p_c$. The larger doping concentration $p_{B1}$ of the first base region 81 will provide a much higher rate of hole collection at a centre of the IGBT underneath the base contact area 821 and away from a critical exposed point of the one or more source regions 6 near the edge of the contact opening. The rest of the one or more source regions 6 is protected by the first base region 81. Furthermore, due to the higher doping concentration $p_{B1}$ of the first base region 81, a higher hole drain at the centre of the IGBT and the smaller radius of curvature $r_{B2}$ will result in a much larger peak field. Hence the main dynamic avalanche point occurs near a periphery of the first base region 81 under the base contact area 821 and away from the critical curvature of the first p-n-junction between the channel region 7 and the drift region 22.

Figure 2A:
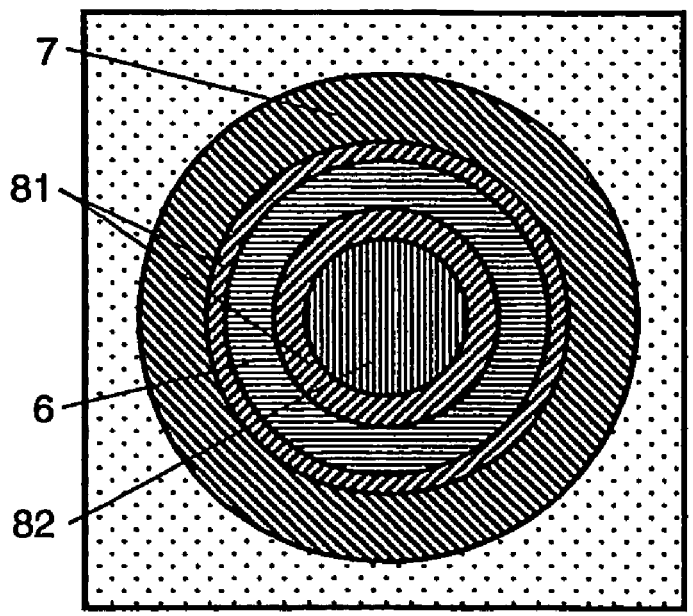
FIG. 2a shows a cross section along line A-B through the IGBT from FIG. 1 in a first configuration.

FIG. 2a shows a cross section along line A-B through the IGBT from FIG. 1 in a first configuration with an essentially circular layout of the p doped channel region 7, the first p+ doped base region 81, the second p+ doped base region 82 and an annular source region 6.

Figure 2B:
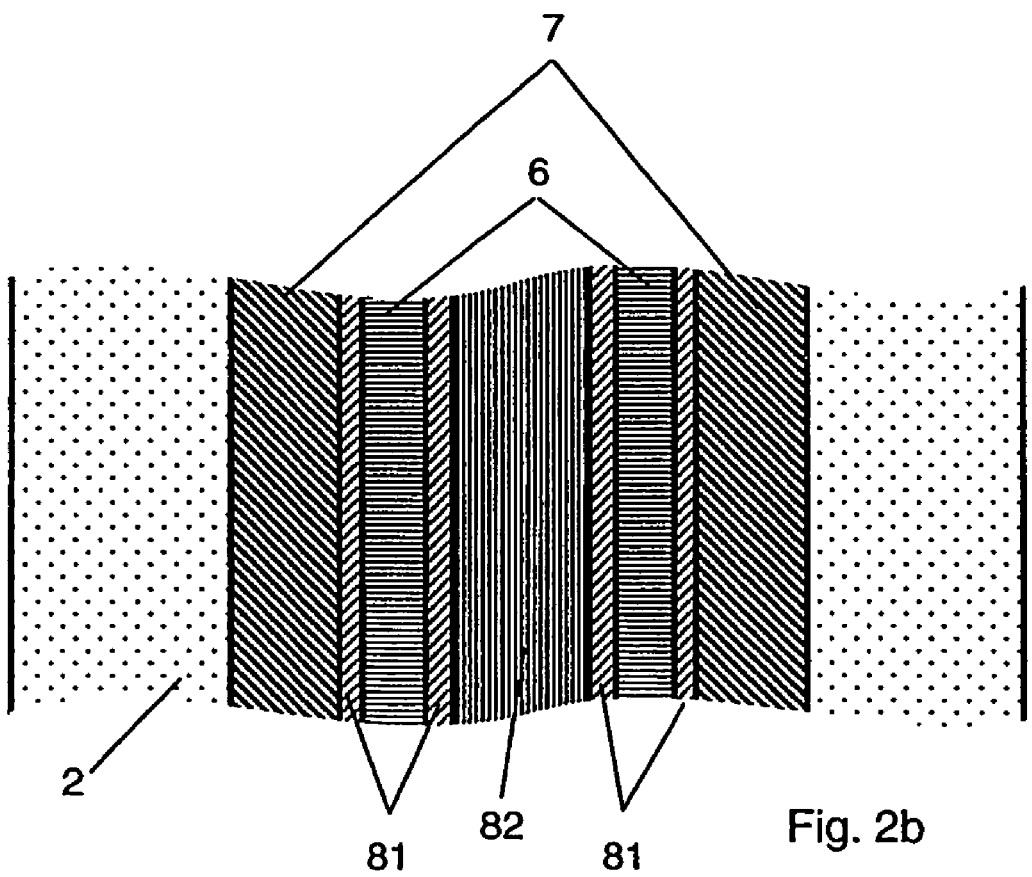
FIG. 2b shows a cross section along line A-B through the IGBT from FIG. 1 in a second configuration.

FIG. 2b shows a cross section along line A-B through the IGBT from FIG. 1 in a second configuration in which the p doped channel region 7, the first p+ doped base region 81 and the second p+ doped base region 82, and the two source regions 6 are strip shaped.

Figure 3:
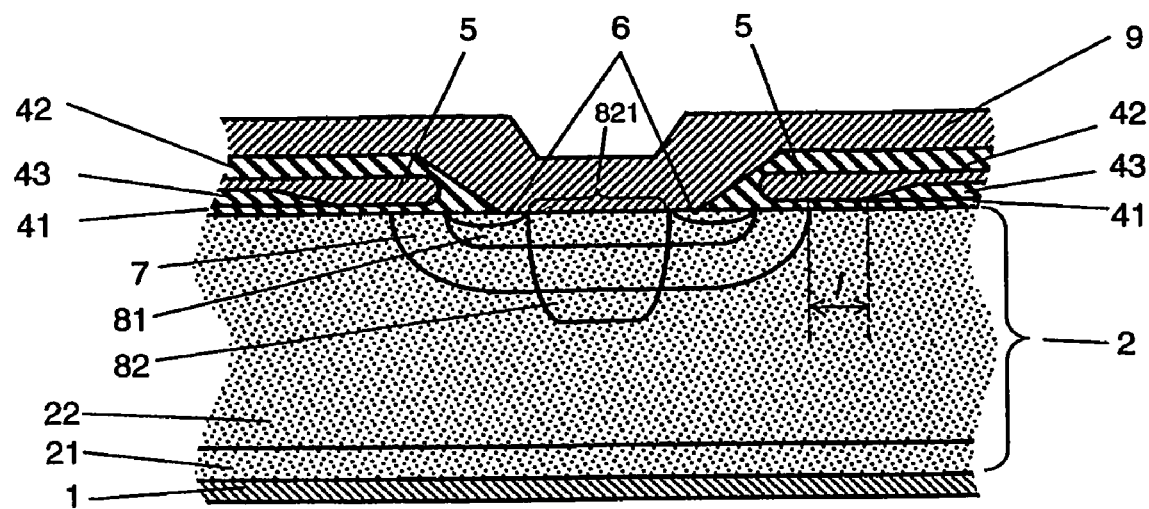
FIG. 3 shows a cross section of another preferred embodiment of an IGBT according to the invention.

FIG. 3 shows a cross section of another preferred embodiment of an IGBT according to the invention. A field oxide layer 43 is disposed on top of the gate oxide layer 41 at a distance d from the edge of the contact opening. This results in a second avalanche region near an edge of the field oxide layer 43, which in turn reduces an amount of avalanche generated carriers in a neighbourhood of the channel region 7. The smaller the distance d from the edge of the field oxide layer 43 to the contact opening, the higher the avalanche level at the edge of the field oxide layer 43, thus providing increased latch-up current. However, if the distance d becomes too small, this will impact the on-state losses and breakdown voltages. Preferably, values for the distance from the field oxide edge to the contact opening range from 8-10 μm. Values in that range have no major impact on other device parameters.

Figure 4:
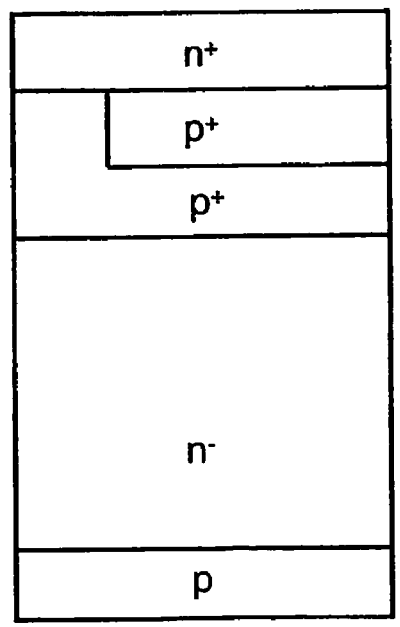
FIG. 4 shows schematic of a protection scheme of the IGBTs from FIGS. 1 and 3.

The IGBT embodiments described above have one protection scheme for increased latch up current of a parasitic thyristor as shown in FIG. 4. The protection from cell latch-up is enhanced with the added two p+ regions 81, 82 in terms of:

a) avalanche peak cell centre positioning,
b) enhanced hole collection at the cell, and
c) n+ source protection.

All three are incorporated in one design with no critical mask alignment issues.

Figure 5:
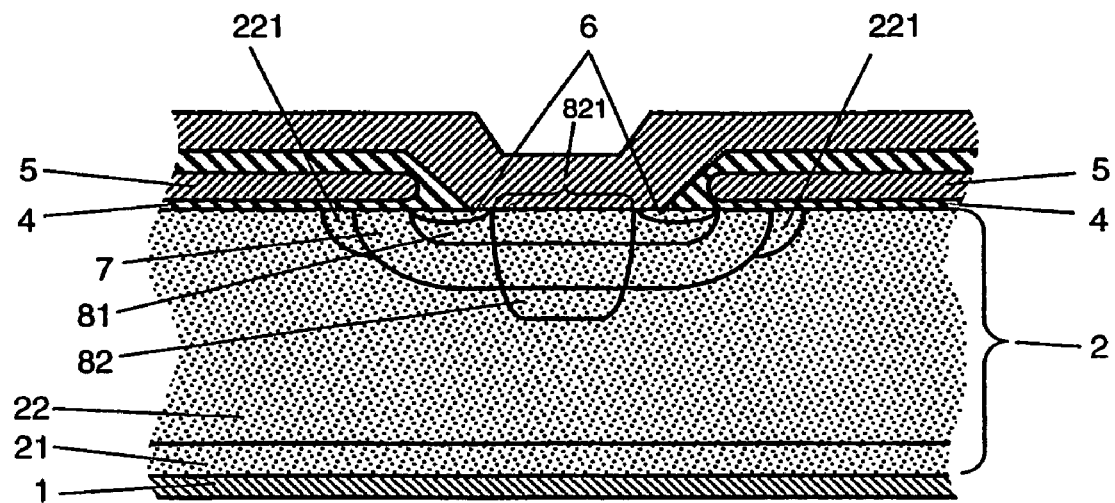
FIG. 5 shows a cross section of another preferred embodiment of an IGBT according to the invention.
Figure 6:
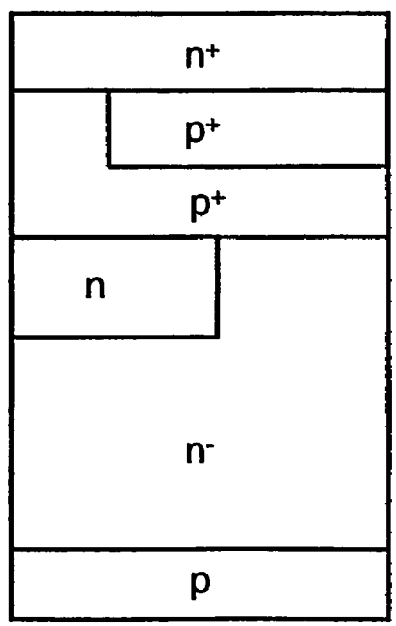
FIG. 6 shows schematic of the protection scheme of the IGBT from FIG. 5.

FIG. 5 shows a cross section of another preferred embodiment of an IGBT according to the invention. An n-doped protection region 221 is disposed near an edge of the channel region 7 in the drift region underneath the gate oxide layer 41, so that it adjoins both the channel region 7 and the top surface of the semiconductor substrate 2. This IGBT has two protection schemes for increased latch up current of a parasitic thyristor as shown in FIG. 6. With the embodiment shown in FIG. 6 the cell latch up is improved using the p+ regions 81, 82 plus the n-doped region 221 at the cell edge. This added n-region 221 acts as a hole barrier and will further reduce the number of holes entering the cell at the channel edge where the latch-up is more likely to occur. Therefore forcing holes to enter from the cell central position.

LIST OF REFERENCE SIGNS

1 Bottom metallization layer
2 Semiconductor substrate
21 Emitter layer
22 Drift region
221 Protection region
41 Gate oxide film, gate insulation film
42 Insulation layer
43 Field oxide layer, gate insulation film
5 Polysilicon gate, gate electrode
6 Source region
7 Channel region
81 First base region
82 Second base region
821 Base contact area
9 Top metallization layer

The invention claimed is:

1. An insulated gate bipolar transistor, comprising
a semiconductor substrate having a top and a bottom surface, a gate insulation film formed on the top surface, said gate insulation film comprising at least one contact opening,
said semiconductor substrate comprising
an emitter layer of first conductivity type adjoining said bottom surface,
a drift region of second conductivity type adjoining said emitter layer,
a channel region of first conductivity type with a doping concentration $p_C$ formed in the drift region underneath the contact opening and underneath part of the gate insulation film,
one or more source regions of second conductivity type disposed in the channel region and delimiting a base contact area;
a gate electrode formed on the gate insulation film,
a bottom metallization layer formed on the bottom surface,
a top metallization layer covering the contact opening and being contacted by one or more source regions,
wherein
a first base region of first conductivity type with a doping concentration $p_{B1}$ is disposed in the channel region so that it encompasses the one or more source regions, wherein
at least one common boundary line on the top surface is formed by the first base region, the one or more source regions and the channel region on the top surface, wherein
the doping concentration $p_{B1}$ of the first base region is higher than the doping concentration $p_C$ of the channel region, wherein a second base region with a doping concentration $p_{B2}$ of first conductivity type is laterally confined in the semiconductor substrate to a region underneath the base contact area so that it partially overlaps with the channel region and with the first base region, and wherein the doping concentration $p_{B2}$ of the second base region is higher than the doping concentration $p_C$ of the channel region.

2. The insulated gate bipolar transistor as claimed in claim 1, wherein a depth $d_{B2}$ of the second base region exceeds a depth $d_C$ of the channel region by at least a factor of 1.5, i.e. $d_{B2} > 1.5\, d_C$.

3. The insulated gate bipolar transistor as claimed in claim 1, wherein a doping concentration $p_{B1}$ of the first base region and a doping concentration $p_{B2}$ of the second base region (82) are at least 5 times higher than a doping concentration $p_C$ of the channel region (7), i.e. $p_{B1} > 5.0\, p_C$, $p_{B2} > 5.0\, p_C$.

4. The insulated gate bipolar transistor as claimed in claim 1, wherein at least one protection region of second doping type is disposed in the drift region underneath the gate oxide layer, said at least one protection region adjoining both the channel region and the top surface of the semiconductor substrate.

5. The insulated gate bipolar transistor as claimed in claim 1, wherein a thickness of the gate insulation film increases at a distance /from the contact opening.

* * * * *